(12) United States Patent
Watanabe

(10) Patent No.: US 10,715,164 B2
(45) Date of Patent: Jul. 14, 2020

(54) A-D CONVERSION CIRCUIT

(71) Applicant: DENSO CORPORATION, Kariya, Aichi-pref. (JP)

(72) Inventor: Takamoto Watanabe, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/528,825

(22) Filed: Aug. 1, 2019

(65) Prior Publication Data

US 2020/0052710 A1   Feb. 13, 2020

(30) Foreign Application Priority Data

Aug. 8, 2018 (JP) .................. 2018-149403

(51) Int. Cl.
  *H03M 1/12* (2006.01)
  *H03K 17/687* (2006.01)
  *H03K 19/20* (2006.01)

(52) U.S. Cl.
  CPC ............ *H03M 1/12* (2013.01); *H03K 17/687* (2013.01); *H03K 19/20* (2013.01)

(58) Field of Classification Search
  CPC ........ H03M 1/12; H03K 17/687; H03K 19/20
  USPC ................................ 341/135–160
  See application file for complete search history.

(56) References Cited

U.S. PATENT DOCUMENTS

| 5,396,247 | A | 3/1995 | Watanabe et al. | |
|---|---|---|---|---|
| 7,755,530 | B2 * | 7/2010 | Terazawa | H03M 1/502 341/157 |
| 2003/0011502 | A1 * | 1/2003 | Watanabe | G04F 10/005 341/157 |
| 2003/0201927 | A1 * | 10/2003 | Watanabe | G04F 10/005 341/157 |
| 2006/0244649 | A1 * | 11/2006 | Terazawa | G04F 10/005 341/155 |
| 2009/0021407 | A1 * | 1/2009 | Terazawa | H03M 1/502 341/122 |
| 2013/0249722 | A1 * | 9/2013 | Terazawa | H03M 1/0621 341/120 |
| 2019/0334542 | A1 * | 10/2019 | Watanabe | H03M 1/60 |

* cited by examiner

*Primary Examiner* — Lam T Mai
(74) *Attorney, Agent, or Firm* — Posz Law Group, PLC

(57) ABSTRACT

An A-D conversion circuit configured to convert an analog input signal into numerical data using a pulse delay circuit includes pulse position digitizing units, a clock generation circuit, and a processing unit. The clock generation circuit includes inverters each including one or more n-channel transistors and one or more p-channel transistors. The inverters differ from each other in a number ratio of the number of n-channel transistors connected in a common-gate parallel-connected manner and the number of p-channel transistors connected in a common-gate parallel-connected manner.

10 Claims, 15 Drawing Sheets (p, n) = (2, 3)

(p, n) = (2, 4)

(p, n) = (2, 5)

A-D CONVERSION CIRCUIT

CROSS REFERENCE TO RELATED APPLICATIONS

This application is based on Japanese Patent application No. 2018-149403 filed on Aug. 8, 2018, disclosure of which is incorporated herein by reference.

TECHNICAL FIELD

The present disclosure relates to an A-D conversion circuit.

BACKGROUND

There is an A-D (Analog-to-Digital) conversion circuit that converts an analog input signal into numerical data by using a pulse delay circuit in which multiple delay units for delaying a pulse signal to output the signal are connected in series. Such A-D conversion circuits are in development.

SUMMARY

The present disclosure provides an A-D conversion circuit. In one example, an A-D conversion circuit comprises a plurality of pulse position digitizing units, a clock generation circuit and a processing unit. The clock generation circuit includes a plurality of inverters connected as at least a one-stage circuit, and outputs a plurality of sampling clocks having mutually-different clock edge timings based on an input clock reference signal. Each of the plurality of inverters includes one or more n-channel transistors and one or more p-channel transistors. The plurality of inverters are different from each other in a number ratio between the number of n-channel transistors connected in a common-gate and parallel-connection manner and the number of p-channel transistors connected in a common-gage and parallel-connection manner.

DETAILED DESCRIPTION

Figure 1:
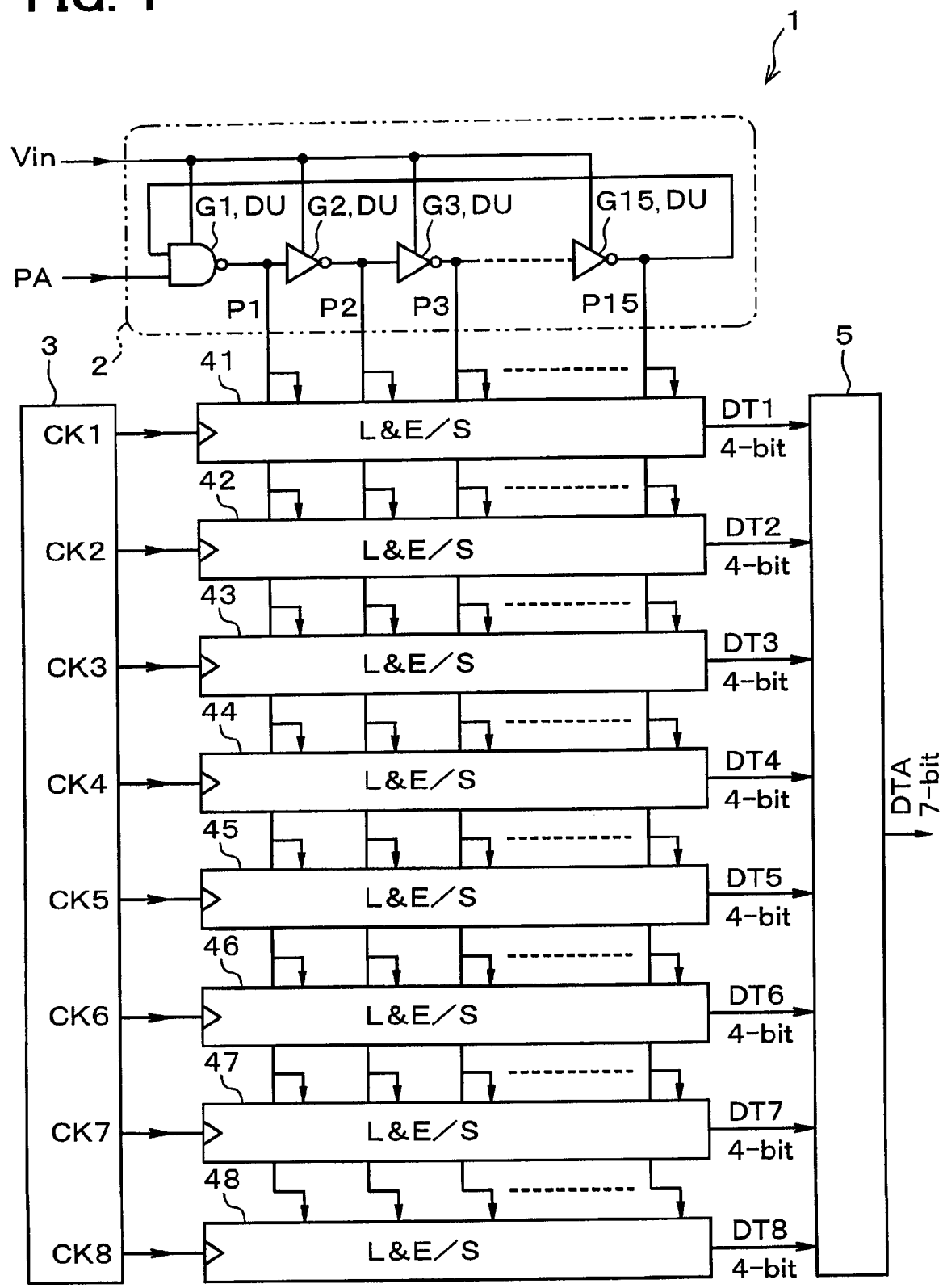
FIG. 1 is a diagram illustrating an electrical configuration of an A-D conversion circuit according to a first embodiment.

An A-D conversion circuit is in development so that high-resolution digital values are obtainable with a simplified configuration. Such an A-D conversion device includes a pulse delay circuit in which multiple delay units including various gate circuits are connected in series. The A-D conversion device is configured to receive a pulse signal for transmission (start pulse) and at the same time supply an A-D conversion target analog input signal as a power supply voltage of the pulse delay circuit.

In the pulse delay circuit, the pulse signal is delayed by a delay time that depends on the power supply voltage of each delay unit. During transmission of the pulse signal, the number of delay units through which the pulse signal has passed within a predetermined sampling time is counted. Thereby, the analog input signal is converted into numerical data. This A-D conversion device is constructed using a single pulse delay circuit, multiple pulse position digitizing units, and a sampling clock generation circuit, and is called an A-D conversion circuit of clock edge shift (CKES) type.

In the sampling clock generation circuit, inverters including p-channel transistors and n-channel transistors are cascade-connected to form two-stages inverters. The delay times of these inverters are set different from each other by providing the inverters with different switching levels (threshold voltages). When these inverters are constructed using typical planar type MOSFETs (Planar-Type FET), different sizes (e.g., different gate length L, different gate widths W) are set to different invertors.

In recent years, design rules of CMOS manufacturing processes are rapidly shrinking and studies are being made on use of so-called a three-dimensional transistor. When the design rule becomes small, the delay time of the above-mentioned delay unit (inverter) used in the above-principle-based conversion circuit is significantly reducible. It becomes possible to increase the number of delay units and improve performance enjoying the benefit of the miniaturization.

In order to further improve performance, it is conceivable to increase the number of pulse position digitizing units.

This may shorten the time interval between clock edges of adjacent sampling clocks generated by the sampling clock generation circuits and may require a large number of sampling clocks.

In this regard, constructing of transistors using the above-described shrinking design rules may impose design constraints. For example, the use of a FinFET for the transistors may cause these transistors to have approximately the same gate width and may make it difficult to continuously vary the gate width. Because it is difficult to continuously vary the transistors in gate width, it is difficult to construct a sampling clock generation circuit in particular. Even if planar transistors are used, similar difficulty arises when the miniaturization progresses.

In view of the above, an object of the present disclosure is to provide an A-D conversion circuit that facilitates constructing a clock generation circuit even when design rules are further shrunk.

In an aspect, the present disclosure is directed to an A-D conversion circuit that is configured to convert an analog input signal into numerical data using a pulse delay circuit in which a plurality of delay units each for delaying and outputting a pulse signal with or without inverting the pulse signal are connected in series. The A-D conversion circuit comprises: a plurality of pulse position digitizing units that, at different timings, digitize a position of the pulse signal when the pulse delay circuit transmits the pulse signal through the delay units; a clock generation circuit that includes a plurality of inverters connected as at least a one-stage circuit, and that, based on an input clock reference signal, outputs a plurality of sampling clocks having mutually-different clock edge timings; and a processing unit that outputs the numerical data relating to A-D conversion based on digitization results of the plurality of pulse position digitizing units. Each of the plurality of inverters includes one or more n-channel transistors and one or more p-channel transistors. The plurality of inverters are different from each other in a number ratio between the number of n-channel transistors connected in a common-gate and parallel-connection manner and the number of p-channel transistors connected in a common-gage and parallel-connection manner. The plurality of pulse position digitizing units include latch circuits that latch the pulse signal of the pulse delay circuit at different timings in accordance with the clock edges of the sampling clocks. The plurality of pulse position digitizing units digitize the position of the pulse signal at different timings.

With the above configuration, adjustment of the number ratio between the number of n-channel transistors and the number of p-channel transistors makes it possible to generate the clock edges at mutually-different timings. Accordingly, construction of a clock generation circuit which generates a number of sampling clocks is facilitated even in the case of design rule shrinking.

Hereinafter, some embodiments of an A-D conversion device will be more specifically described with reference to the drawings. In the respective embodiments, the same or similar references (for example, the same reference numerals in the first and tenth places and another reference numeral in the hundredth place) are used to refer to substantially the same or similar portions to omit redundant description.

First Embodiment

FIGS. 1 to 15 are diagrams for explanation on the first embodiment. FIG. 1 schematically illustrates an A-D conversion circuit 1 of time A-D system (TAD: Time Analog to Digital Converter). The A-D conversion circuit 1 is provided inside a semiconductor integrated circuit device such as a microcomputer mounted in an electronic control unit (hereinafter referred to as an ECU) of an automobile and a sensor product having a function of digital communication with the ECU, and is constructed using a CMOS manufacturing process. The A-D conversion circuit 1 receives an analog input signal Vin output from a sensor or the like, converts the analog input signal Vin into numerical value data DT serving as a digital value, and outputs the numerical value data DT.

The A-D conversion circuit 1 includes a ring-arranged pulse delay circuit 2 (hereinafter simply referred to as pulse delay circuit), a clock generation circuit 3, and multiple pulse position digitizing units (L&E/S: Latch & Encoder and Subtractor) 4, and an adder 5 serving as a processing unit.

(Description of Configuration of Pulse Delay Circuit 2)

The pulse delay circuit 2 includes multiple delay units DU (G1 to G15) connected in series into a ring arrangement. The delay unit DU (G1 to G15) inverts and delays a pulse signal PA. The delay units DU, respectively, include gate circuits G1 to G15. The gate circuit G1 to G15 delays a pulse signal PA by a predetermined delay time Td to output the signal. For this reason, in the following description, one or more delay units may be referred as DU or G1 to G15. The pulse delay circuit 2 is configured to output the output of each delay unit DU (G1 to G15) to the pulse position digitizing units 41 to 48.

An analog input signal Vin to be subjected to A-D conversion is input as a power supply voltage (drive voltage) to each gate circuit G1 to G15. Each gate circuit G1 to G15 outputs a signal according to the analog input signal Vin. As each gate circuit G1 to G15, any gate circuit can be used as long as the delay time Td changes according to the analog input signal Vin. However, as shown in FIG. 1, it may be preferable to construct the delay units DU by combining the NAND gate G1 and the NOT gates G2 to G15.

The pulse delay circuit 2 shown in FIG. 1 is constructed using the first-stage NAND gate G1 and the even number of subsequent-stage NOT gates G2 to G15. The even number of NOT gates G2 to G15 are connected in cascade. The NAND gate G1 is configured to receive the pulse signal PA and to receive the output of the last-stage NOT gate G15. Thus, when the pulse signal PA is input to the pulse delay circuit 2, the pulse signal PA is transmitted and circulated by the pulse delay circuit 2.

Figure 2:
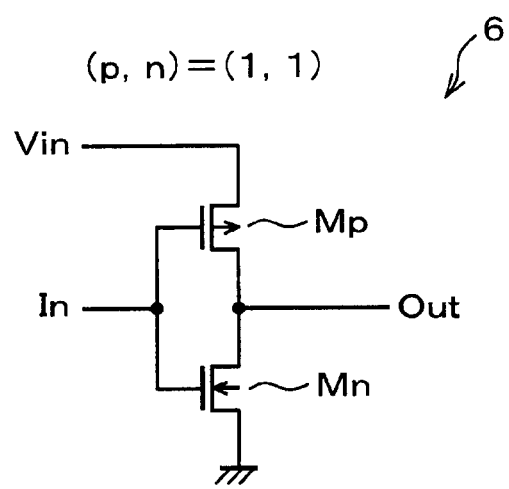
FIG. 2 is a diagram showing a first example of an electrical configuration of the inverter.

It may be preferable to construct the NOT gates G2 to G15 using, for example, CMOS inverters 6 as shown in FIG. 2, in order to simplify a circuit configuration and shorten the delay time Td as much as possible to enhance time resolution. For example, as shown in FIG. 2, in the CMOS inverter 6, the source and the drain of a p channel transistor Mp and the drain and source of an n channel transistor Mn are connected in series between a supply node of the analog input signal Vin and a ground node. Further, the gate of the p-channel transistor Mp and the gate of the n-channel transistor Mn are commonly connected to a common point. A common connection node of the gate of the p-channel transistor Mp and the gate of the n-channel transistor Mn serves as an input terminal In. A common connection node of the drain of the n-channel transistor Mn and the drain of the p-channel transistor Mp serves as the output terminal Out.

When the NOT gate G2 to G15 is constructed with this kind of CMOS inverter 6, each of the NOT gates G2 to G15 can be constructed with two transistors. Suppose that the NOT gate G2 to G15 is constructed with a single-stage CMOS inverter 6. In this case, when the pulse signal PA input to the pulse delay circuit 2 is switched from a low level (also referred to as L level) to a high level (also referred to as H level), the signal switches from the H level to the L level at the odd-number-th-stage, and switches from the L level to the H level at the even-number-th-stage. When the NOT gate G2 to G15 is constructed with the single-stage CMOS inverters 6, it is possible to shorten the delay time Td and obtain an A-D conversion result more quickly.

<Configuration of Clock Generation Circuit 3>

Figure 3:
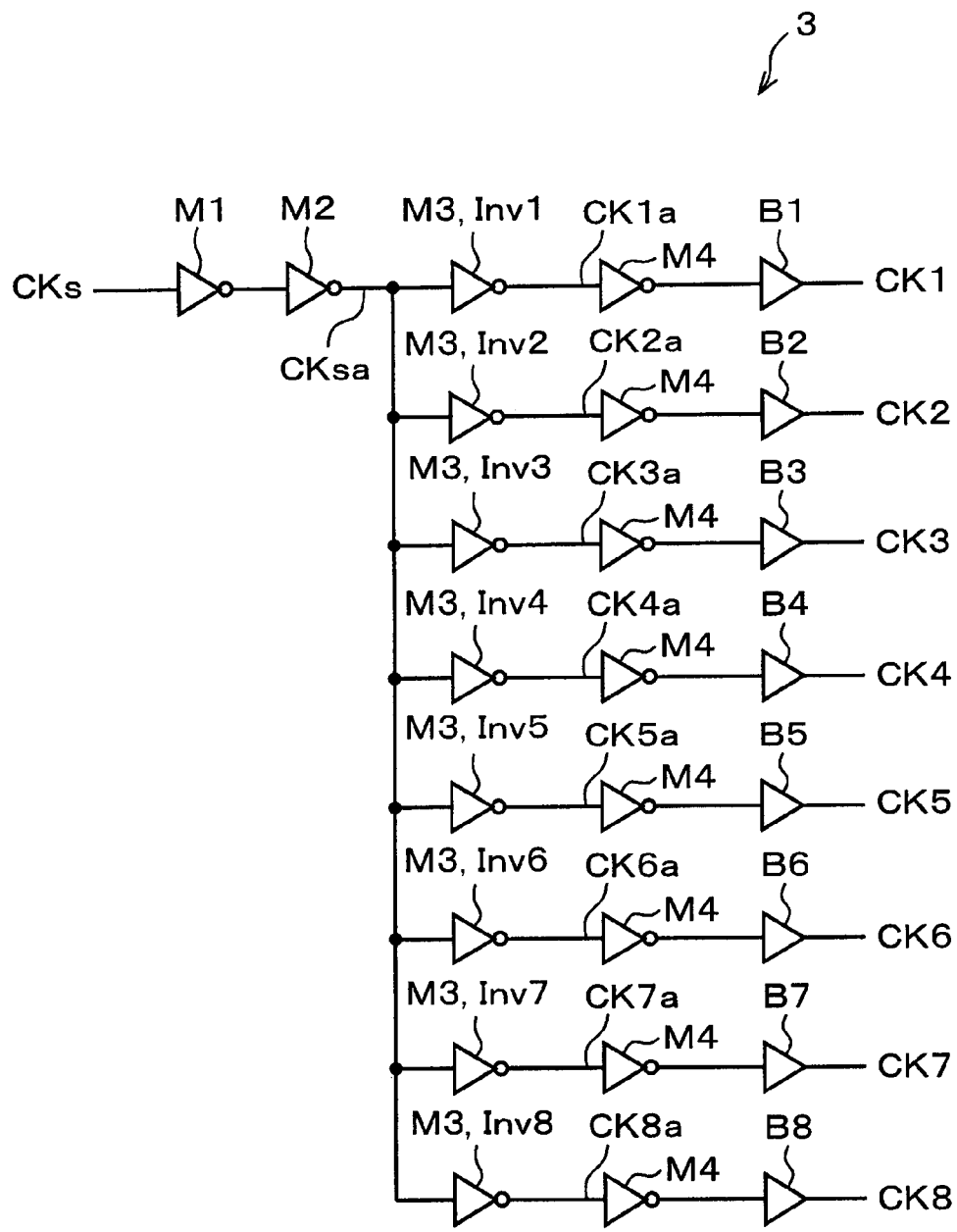
FIG. 3 is a diagram illustrating an electrical configuration of a clock generation circuit.

FIG. 3 illustrates an electrical configuration of the clock generation circuit 3. As shown in FIG. 3, the clock generation circuit 3 includes inverters M1 to M4 arranged to form multiple-stages circuit (for example, four stages), and outputs multiple sampling clocks CK1 to CKm through buffers B1 to Bm. The buffers B1 to Bm is at a later stage than the inverters M1 to M4. In the configuration of FIG. 3, the inverter M1 is the first-stage, the inverter M2 is the second-stage, the inverter M3 is the third-stage, and the inverter M4 is the fourth-stage. The present embodiment adopts m=8.

The analog input signal Vin is applied to these multi-stages inverters M1 to M4 as power supply voltages (drive voltages). The delay times of the sampling clocks CK1 to CK8 are adjusted in accordance with the delay time Td of the pulse signal PA in the pulse delay circuit 2. In this relation, the clock generation circuit 3 generates the multiple sampling clocks CK1 to CK8 based on the clock reference signal CKs input as a reference. This clock reference signal CKs is a reference signal that is input externally.

Input terminals In of the multiple inverters M3 are connected to the same node (see Inv1 to Inv8 in FIG. 3). Therefore, in the following description, the inverters M3 may be referred to as M3 (Inv1 to Inv8) or Inv1 to Inv8 on an as-needed basis. In the example shown in FIG. 3, the single inverter M1 and the single inverter M2, respectively, are cascade-connected to form the first-stage and the second-stage. An output terminal Out of the second-stage inverter M2 is connected to input terminals In of the third-stage multiple inverters M3 (Inv1 to Inv8).

The first-stage inverter M1 receives the clock reference signal CKs, transmits a pulse to output the pulse to the second-stage inverter M2. The second-stage inverter M2 also transmits the pulse and outputs the pulse to the third-stage multiple inverters M3 (Inv1 to Inv8). The output of the second-stage inverter M2 is referred to as a clock reference signal CKsa. The third-stage multiple inverters M3 (Inv1 to Inv8) relatively change a delay time difference ΔT in clock rising edge.

The multiple inverters M4 are connected to form the fourth-stage next to the third-stage inverters M3 (Inv1 to Inv8), respectively. The buffers B1 to B8 are at a stage later than the fourth-stage inverters M4 in order to drive the latch circuits 12 of the pulse position digitizing units 41 to 48.

The first-stage inverter M1, the second-stage inverter M2 and the fourth-stage invertors M4 are constructed using the CMOS inverters shown in FIG. 2, wherein the CMOS inverter shown in FIG. 2 includes a combination of the p-channel transistor Mp and the n-channel transistor Mn. For example, the first-stage inverter M1 and the fourth-stage inverters M4 are constructed using the CMOS inverters 6 having a delay time Td. The second-stage inverter M2 is constructed to have a driving capability that is twice as large as the inverter M1 and M4. The second-stage inverter M2 is characterized to have, for example, a delay time Td/2 for a rising time or a falling time, which is half of the delay time Td of the gate circuit G2 to G15 of the delay unit.

Further, the third-stage inverters M3 (Inv1 to Inv8) have different configurations. The third-stage inverter M3 (Inv1 to Inv8) may have the configuration having the CMOS inverter 6 of FIG. 2, or may have a configuration having an inverter 106, 206, 306, 406, 506, 706, 806 and/or 906 (also referred to hereinafter as inverter 106 to 906 for simplicity) of FIGS. 5 to 13.

Each inverter 106 to 906 shown in FIGS. 5 to 13 has, as its basic configuration, the configuration of the CMOS inverter 6 shown in FIG. 2. The inverters 106 to 906 differ in the number of common-gate parallel-connected p-channel transistors Mp and the number of common-gate parallel-connected n-channel transistors Mn. The number of common-gate parallel-connected p-channel transistors Mp is the number of p-channel transistors connected in a common-gate and parallel-connection manner. The number of common-gate parallel-connected n-channel transistors Mn is the number of n-channel transistors connected in a common-gate and parallel-connection manner. Therefore, in the following, the configuration of the third-stage inverters Inv1 to Inv8 may be described using the number of common-gate parallel-connected n-channel transistors Mn and the number of common-gate parallel-connected n-channel transistors Mn on an as-needed basis.

Figure 5:
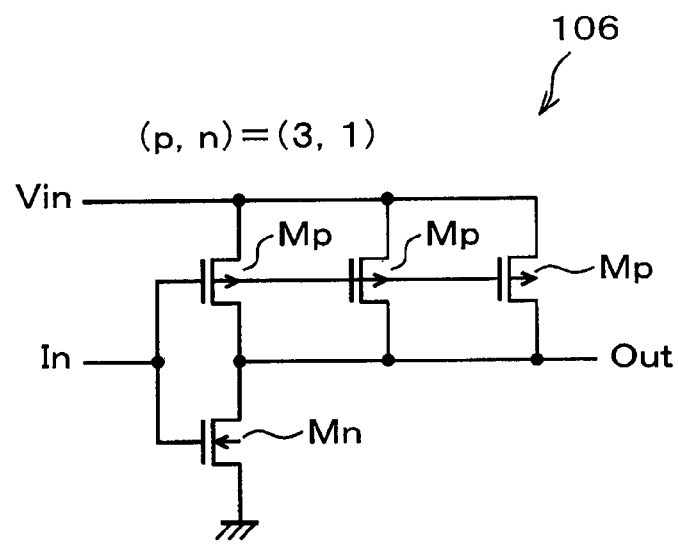
FIG. 5 is a diagram showing a second example of an electrical configuration of an inverter.
Figure 6:
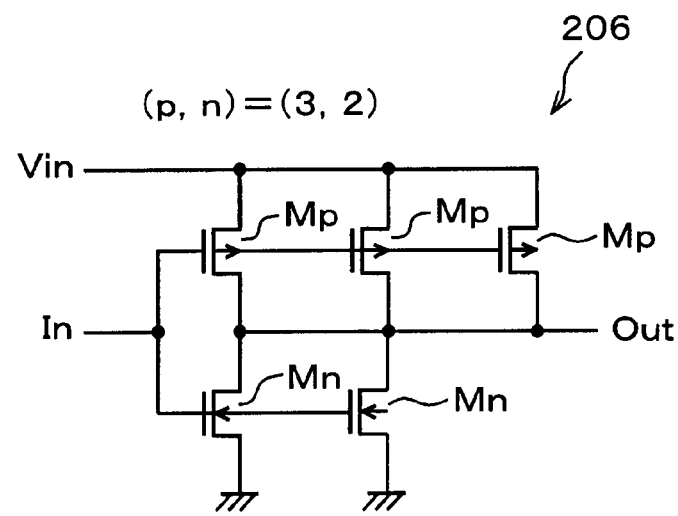
FIG. 6 is a diagram showing a third example of an electrical configuration of the inverter.
Figure 7:
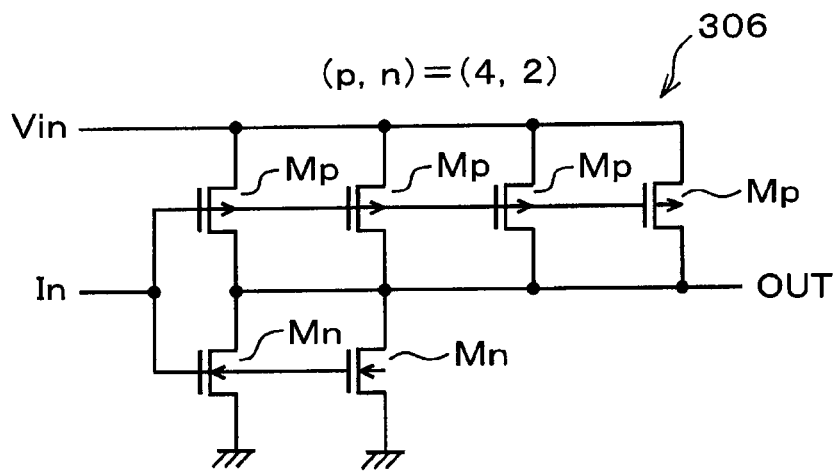
FIG. 7 is a diagram showing a fourth example of the electrical configuration of an inverter.
Figure 8:
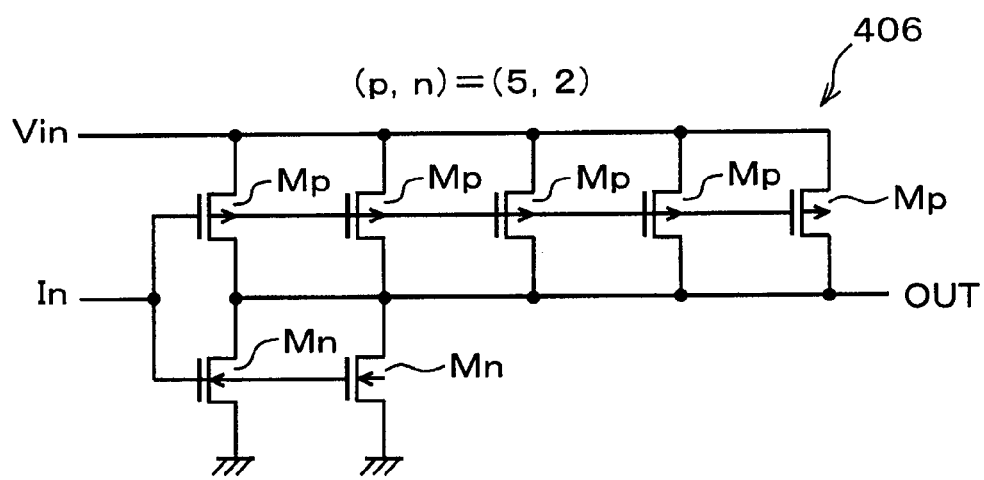
FIG. 8 is a diagram showing a fifth example of an electrical configuration of an inverter.
Figure 9:
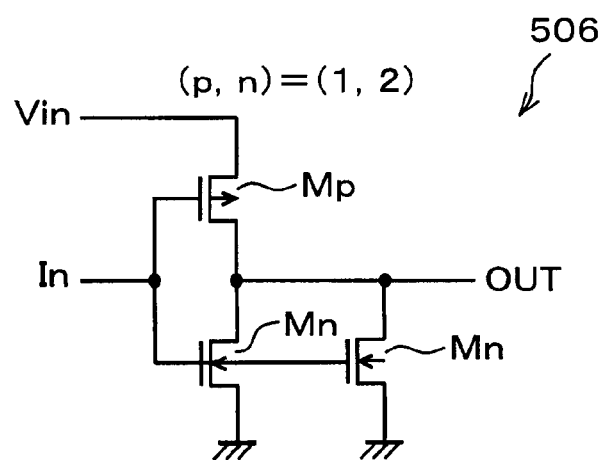
FIG. 9 is a diagram showing a sixth example of an electrical configuration of an inverter.
Figure 10:
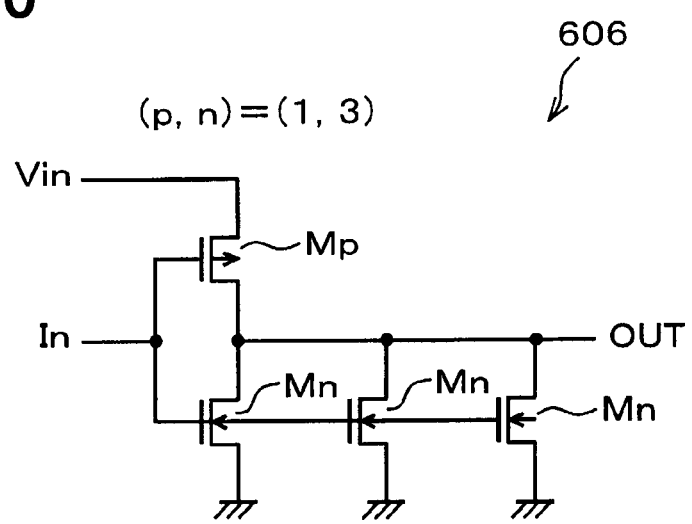
FIG. 10 shows a seventh example of an electrical configuration of an inverter.
Figure 11:
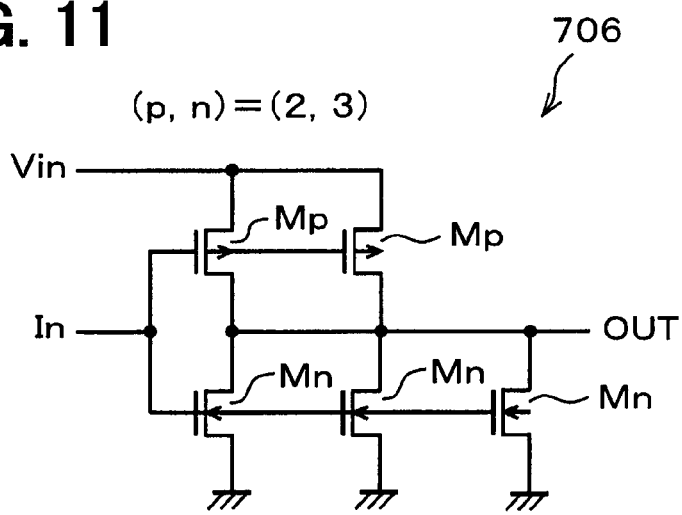
FIG. 11 is a diagram showing an eighth example of an electrical configuration of an inverter.
Figure 12:
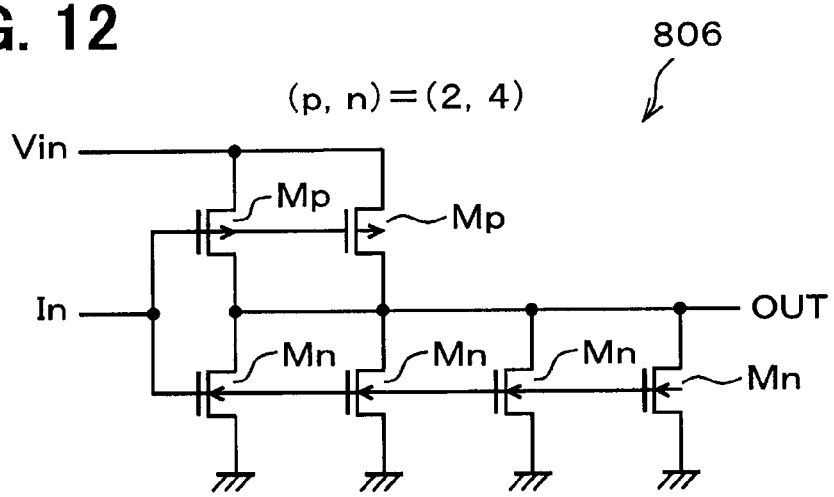
FIG. 12 is a diagram showing a ninth example of an electrical configuration of an inverter.
Figure 13:
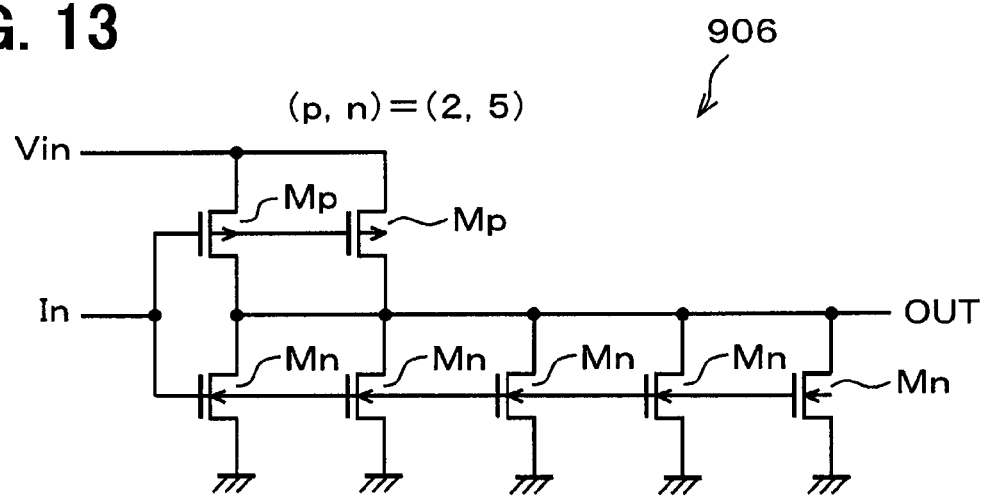
FIG. 13 is a diagram showing a tenth example of an electrical configuration of an inverter.

The CMOS inverter 6 shown in FIG. 2 is expressed as (p, n)=(1, 1) because there is one p-channel transistor Mp and one n-channel transistor Mn. Similarly, the CMOS inverters 106 to 906 shown in FIGS. 5 to 13 are expressed as follows:

Inverter 106 in FIG. 5 is (p, n)=(3, 1);
Inverter 206 in FIG. 6 is (p, n)=(3, 2);
Inverter 306 in FIG. 7 is (p, n)=(4, 2);
Inverter 406 in FIG. 8 is (p, n)=(5, 2);
Inverter 506 in FIG. 9 is (p, n)=(1, 2)
Inverter 606 in FIG. 10 is (p, n)=(1, 3);
Inverter 706 in FIG. 11 is (p, n)=(2, 3);
Inverter 806 in FIG. 12 is (p, n)=(2, 4); and
Inverter 906 in FIG. 13 is (p, n)=(2, 5).

The inverters 106 to 906 shown in FIGS. 5 to 13 are constructed using a miniaturized process, so that an integration degree can increase as compared with a conventionally-used CMOS inverter of planar-type. Transistor structures that can be constructed using this process include a FinFET structure 7, a perspective view of which is illustrated in FIG. 14.

A gate structure 11 of this FinFET structure 7 is formed in, for example, the follow way. Necessary impurity (for example, p-type, n-type) is doped to a surface of a silicon substrate 8. Thereafter, element separation trenches are formed in parallel lines in one direction. An oxide 9 is deposited in the element isolation trenches to realize element separation and to form fins 10. A conductive material such as silicon is deposited from above the fins 10 and the oxide 9. The FinFET structure 7 is formed, for example, with a design rule of about 7 nm. In the FinFET structure 7, the fins 10 separated by the element separation region are provided as a source and a drain.

Figure 14:
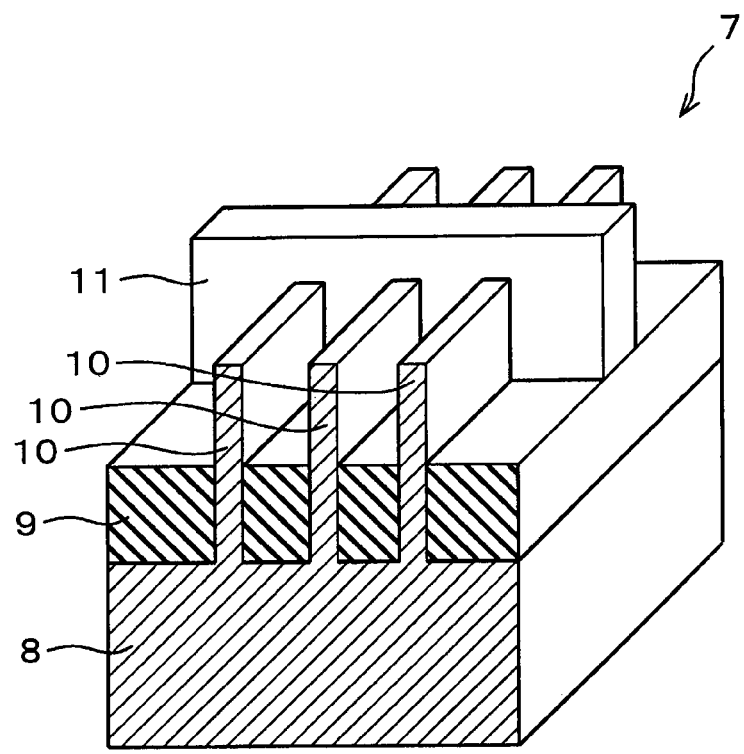
FIG. 14 is a perspective view schematically illustrating a FinFET (Fin Field-Effect transistor) structure.

As shown in FIG. 14, the multiple fins 10 are spaced apart from each other and arranged in parallel in one direction. The gate structure 11 is constructed so as to cover these multiple fins 10. In this way, it is possible easily construct the multiple transistors Mp (or Mn) in which the multiple fins 10 are covered with the gate structure 11. By adopting this FinFET structure 7, it is possible to increase the number of common-gate parallel-connected transistors Mp, Mn per unit volume. By changing the impurity to be doped, it is possible to selectively form the p-channel transistor Mp or the n-channel transistor. Therefore, by using such FinFET structure 7, it is possible to easily construct the inverters 106 to 906 shown in FIGS. 5 to 13.

Next, a method of setting the number of n-channel transistors Mn and the number of p-channel transistors Mp in each third-stage inverter M3 (Inv1 to Inv8) will be described.

An electron mobility in the n-channel transistor Mn is larger than the hole mobility in the p-channel transistor Mp. For this reason, the n-channel transistor Mn operates faster than the p-channel transistor Mp. Therefore, by providing the relatively large number of common-gate parallel-connected p channel transistors Mp as compared with the number of common-gate parallel-connected n channel transistors Mn, it is possible to lengthen the rising delay time difference ΔT in the clock edge. By contrast, by providing the relatively small number of common-gate parallel-connected p channel transistors Mp as compared with the number of common-gate parallel-connected n channel transistors Mn, it is possible to shorten the rise delay time difference ΔT in the clock edge.

In other words, when the number of n-channel transistors Mn is one and the number of p-channel transistors Mp is two or more in the inverter M3 (Inv1 to Inv8), the rising delay time difference ΔT of the clock edge is lengthened. In addition, when the number of n-channel transistors Mn is one or more, it is possible to increase the degree of freedom in design.

Put differently, if the number of n-channel transistors Mn constituting the inverter M3 (Inv1 to Inv8) is 2 or more and the number of p-channel transistors Mp is one, the rising delay time difference ΔT of the clock edge can be decreased. Further, if the number of p-channel transistors Mp is one or more, the degree of freedom in design can be increased.

Put further differently, by changing the number of p-channel transistors Mp and the number of n-channel transistors Mn in each inverter M3 (Inv1 to Inv8), it is possible to change a switching level (threshold voltage) of this inverter M3 (Inv1 to Inv8).

Figure 15:
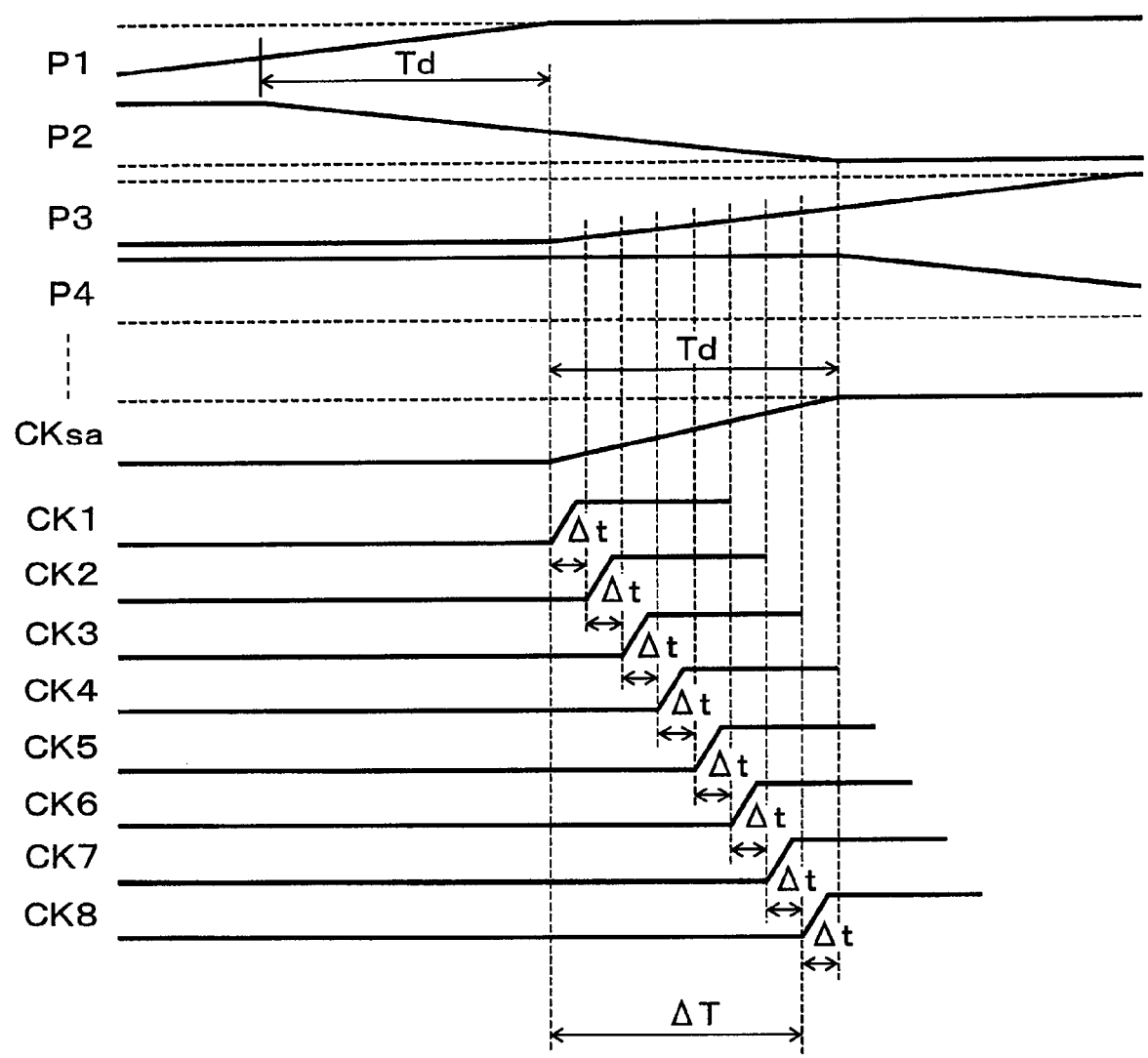
FIG. 15 is a diagram illustrating a temporal relationship between a delayed pulse signal and a clock edge of a sampling clock.

For example, as shown in FIG. 15, in order to make the rising delay time difference ΔT from the clock edge of the sampling clock CK1 as short as possible, it may be preferable to minimize the number ratio p/n of the number of common-gate connected p channel transistors Mp and the number of common-gate connected n channel transistors Mn in the inverter Inv1. Further, as shown in FIG. 15, in order to make the rising delay time difference ΔT from the clock edge of the sampling clock CK8 as long as possible, it may be preferable to maximize the number ratio p/n of the number of common-gate connected p channel transistor Mp and the number of n channel common-gate connected n channel transistor Mn in the inverter Inv8. Additionally, it may be preferable to increase the number ratios p/n of the inverter Inv2 to Inv7 in order from the inverter Inv2 to the inverter Inv7.

Examples of a combination the number of common-gate connected p-channel transistors Mp and the number of common-gate connected n-channel transistors Mn in each of the inverters Inv1 to Inv8 include the following setting (A1).

(A1) Combination Example A1
Inverter Inv1: (p, n)=(1, 5) (number ratio p/n=0.2)
Inverter Inv2: (p, n)=(2, 5) (number ratio p/n=0.4)
Inverter Inv3: (p, n)=(3, 5) (number ratio p/n=0.6)
Inverter Inv4: (p, n)=(4, 5) (number ratio p/n=0.8)
Inverter Inv5: (p, n)=(5, 5) (number ratio p/n=1.0)
Inverter Inv6: (p, n)=(5, 4) (number ratio p/n=1.25)
Inverter Inv7: (p, n)=(5, 3) (number ratio p/n=1.66 . . . )
Inverter Inv8: (p, n)=(5, 2) (number ratio p/n=2.5)

When the number ratio p/n of one inverter matches that of another inverter, they have substantially the same rise delay time difference ΔT. In view of this, for example, the following setting (A2) is an option in which the number of p-channel transistors Mp and the number of n-channel transistors Mn in the inverter Inv5 are reduced from 5.

(A2) Combination Example A2
Inverter Inv1: (p, n)=(1, 5) (number ratio p/n=0.2)
Inverter Inv2: (p, n)=(2, 5) (number ratio p/n=0.4)
Inverter Inv3: (p, n)=(3, 5) (number ratio p/n=0.6)
Inverter Inv4: (p, n)=(4, 5) (number ratio p/n=0.8)
Inverter Inv5: (p, n)=(1, 1) (number ratio p/n=1.0)
Inverter Inv6: (p, n)=(5, 4) (number ratio p/n=1.25)
Inverter Inv7: (p, n)=(5, 3) (number ratio p/n=1.66 . . . )
Inverter Inv8: (p, n)=(5, 2) (number ratio p/n=2.5)

In the example (A1), the number of p-channel transistors Mp in the inverters Inv5 to Inv8 and the number of n-channel transistors Mn in the inverters Inv1 to Inv5 are uniformly set to the same number=5 serving as the maximum number. For this reason, a variation in characteristics resulting from the process can be suppressed. That is, since either the number of p-channel transistors Mp or the number of n-channel transistors Mn in each inverter Inv1 to Inv8 is set to the same maximum number=5, the variation in characteristics due to the process can be suppressed.

As shown in another example (A2), the number of n-channel transistors Mn and the number of p-channel transistors Mp in the inverter Inv5 satisfy the condition that one of the number of n-channel transistors Mn and the number of p-channel transistors Mp is divisible by the other (i.e., remainder=0). Therefore, the number of p-channel transistors Mp and the number of n-channel transistors Mn of the inverter Inv5 is reduced as compared with the example (A1) while ensuring substantially the same characteristics as the example (A1). This realizes size reduction. In consideration of this, it may be preferable to select a combination of the number of p-channel transistors Mp and the number of n-channel transistors Mn constituting each inverter Inv1 to Inv8 to match design circumstances.

Alternatively, the setting may be made so as to equalize the number of n-channel transistors Mn, as shown in the following example (A3).

(A3) Combination Example A3
Inverter Inv1: (p, n)=(1, 8) (number ratio p/n=1/8)
Inverter Inv2: (p, n)=(2, 8) (number ratio p/n=1/4)
Inverter Inv3: (p, n)=(3, 8) (number ratio p/n=3/8)
Inverter Inv4: (p, n)=(4, 8) (number ratio p/n=1/2)
Inverter Inv5: (p, n)=(5, 8) (number ratio p/n=5/8)
Inverter Inv6: (p, n)=(6, 8) (number ratio p/n=3/4)
Inverter Inv7: (p, n)=(7, 8) (number ratio p/n=7/8)
Inverter Inv8: (p, n)=(8, 8) (number ratio p/n=1)

Alternatively, since the delay times are substantially the same when there is the number ratio p/n matching, the following setting may be used: for the inverter Inv8, (p, n)=(1, 1); for the inverter Inv2, (p, n)=(1, 4); for the inverter Inv4, (p, n)=(1, 2); and/or for the inverter Inv6, (p, n)=(3, 4).

Alternatively, the setting may be made so as to equalize the number of p-channel transistors Mp as shown in the following example (A4).

(A4) Combination Example A4
Inverter Inv1: (p, n)=(8, 8) (number ratio p/n=1)
Inverter Inv2: (p, n)=(8, 7) (number ratio p/n=8/7)
Inverter Inv3: (p, n)=(8, 6) (number ratio p/n=4/3)
Inverter Inv4: (p, n)=(8, 5) (number ratio p/n=8/5)
Inverter Inv5: (p, n)=(8, 4) (number ratio p/n=2)
Inverter Inv6: (p, n)=(8, 3) (number ratio p/n=8/3)
Inverter Inv7: (p, n)=(8, 2) (number ratio p/n=4)

Inverter Inv8: (p, n)=(8, 1) (number ratio p/n=8)

Alternatively, since the same number ratio p/n leads to substantially the same delay time, the following setting may be used: for the inverter Inv1, (p, n)=(1, 1); for the inverter Inv3, (p, n)=(4, 3); for the inverter Inv5, (p, n)=(2, 1); and/or for the inverter Inv7, (p, n)=(4, 1).

As long as the inverters Inv1 to Inv8 have the different number ratios p/n of the number of common-gate parallel-connected p-channel transistors Mp to the number of common-gate parallel-connected n-channel transistors Mn, the numbers may be arbitrary. When the number ratios p/n of the p-channel transistor Mp to the n-channel transistor Mn of the inverters Inv1 to Inv8 are set to increase in order from the inverter Inv1 to the inverter Inv8 as is the case in (A1) to (A4), the inverters Inv1 to Inv8 have the increasing time difference ΔT in delay of the clock edge rising in order.

A period Ts of the sampling clock CK1 to CK8 output from the clock generation circuit 3 to the multiple pulse position digitizing units 41 to 48 is set to a predetermined time period which is sufficiently longer than the delay time Td of each delay unit DU (G1 to G15).

In this relation, as shown in FIG. 15, it may be preferable to set the number of p-channel transistors Mp and the number of n-channel transistors Mn in each inverter inV1 to Inv8 so that a time difference Δt in clock edge between each sampling clock CK1 to CK8 and its adjacent sampling clock is set to a constant time period that is one eighth (=1/m) of the delay time Td. This clock generation circuit 3 can generate sampling clocks CK1 to CK8 in which phases are shifted in unit of the predetermined time difference Δt.

The rise time or the fall time of each delay unit DU of the pulse delay circuit 2 is longer than the rise time or fall time of each sampling clock CK1 to CK8, as shown in FIG. 15. This is because the driving performance of the final-stage buffers B1 to B8 constituting the clock generation circuit 3 is higher than the driving performance of gate circuits G2 to G15 constituting the pulse delay circuit 2.

Further, in order for each pulse position digitizing unit 41 to 48 to perform the digitizing process multiple times in synchronization with the period Ts of the input sampling clock CK1 to CK8, the number of stages of the delay units DU in the pulse delay circuit 2 is set to the number that allows the pulse signal is transmitted for a time period sufficiently longer than the period Ts of the sampling clock CK1 to CK8.

<Configuration of Pulse Position Digitizing Unit 41 to 48>

Referring back to FIG. 1, the description will be given. In synchronization with the timings of the rising (or falling) clock edges of the sampling clocks CK1 to CK8, the multiple pulse position digitizing units 41 to 48 detect the number of delay units DC through which the pulse signal PA inside the pulse delay circuit 2 has passed within one cycle (one period) of the sampling clocks CK1 to CK8, and output numerical data DTA representing the detection results.

In particular, based on a difference in the digitized position of the pulse signal between the previous detection and the present detection, the multiple pulse position digitizing units 41 to 48 calculate the number of delay units DC through which the pulse signal PA inside the pulse delay circuit 2 has passed within one cycle (one period) of the sampling clocks CK1 to CK8. Thereby, the multiple pulse position digitizing units 41 to 48 generate and output the numerical data DT (DT1 to DTm).

Figure 4:
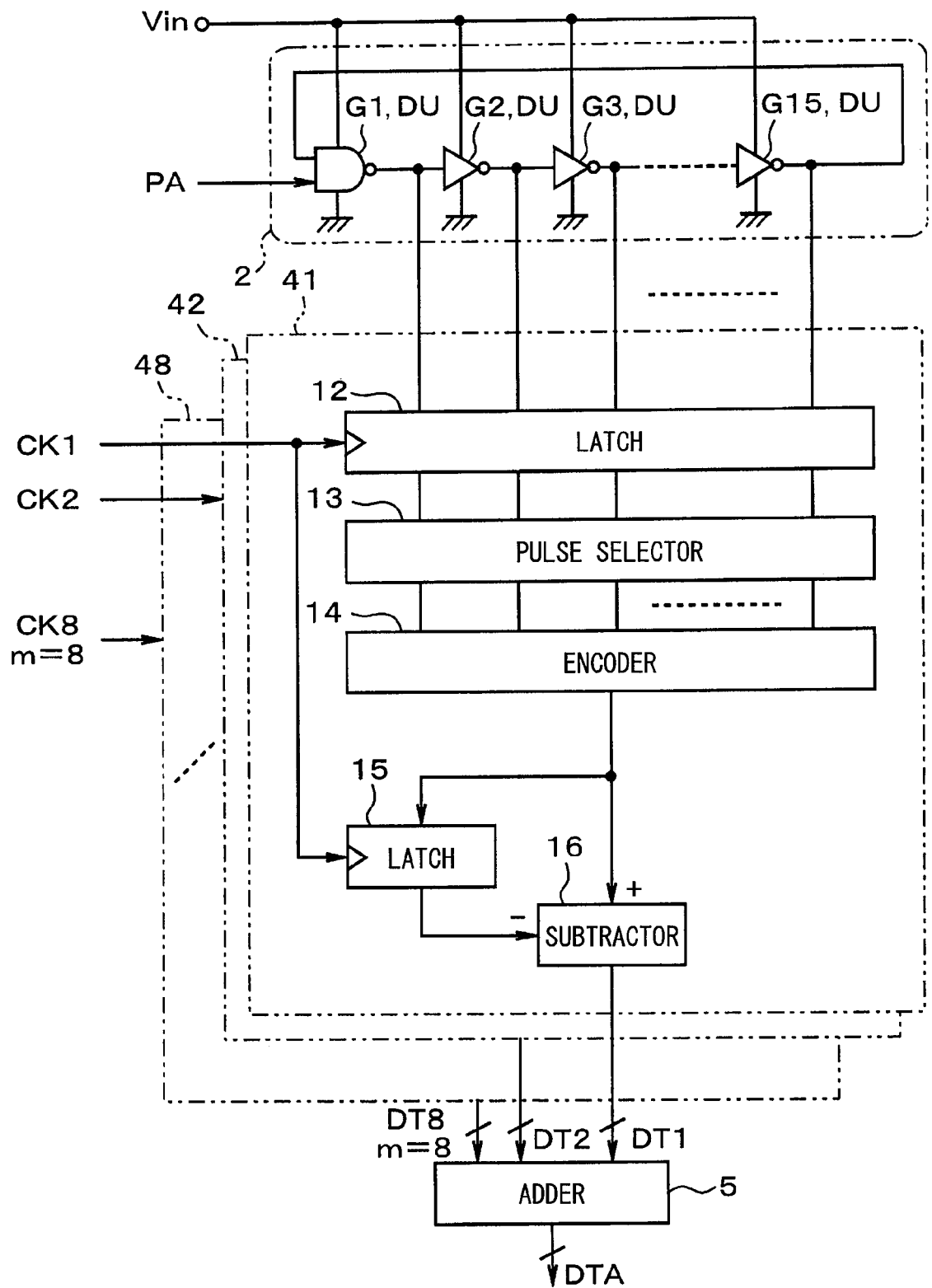
FIG. 4 is a diagram illustrating an electrical configuration of a pulse position digitizing unit.

FIG. 4 schematically illustrates an electrical configuration of an inside of the pulse position digitizing unit 41 to 48. The multiple pulse position digitizing units 41 to 48 may have the same structure and each pulse position digitizing unit 41 to 48 may include a latch circuit 12, a pulse selector 13, an encoder 14, ae latch circuit 15, and a subtractor 16. The multiple pulse position digitizing units 41 to 48 may have the same structure.

The latch circuit 12 latches the H level or the L level of the output of each delay unit DU of the pulse delay circuit 2 in synchronization with the timing of the clock edge of the corresponding sampling clock CK1 to CK8. The pulse selector 13 detects the position at which the output of the delay unit DU changes from H level to L level or the L level to H level based on the output of each delay unit DU latched by the latch circuit 12. As a result, the pulse selector 13 can detect the arrival position of the pulse signal PA which circulates in the pulse delay circuit 2. The pulse selector 13 of the pulse position digitizing unit 41 to 48 detects, as the arrival position of the pulse signal PA, the timing (position) at which the outputs of the adjacent delay unit DU in the pulse delay circuit 2 become the same level.

The encoder 14 is configured to convert the detection result of the pulse selector 13 into numerical data DT, thereby digitizing the arrival position of the pulse signal PA inside the pulse delay circuit 2. The latch circuit 15 latches the data output from the encoder 14, thereby store it as the previous value. The subtractor 16 subtracts the previous value of the data stored in the latch circuit 15 from the present value of the data output from the encoder 14, and outputs this subtraction data as numerical data DT (DT1 to DT8).

The adder 5 generates numerical data DTA, which data is "n+$\log_2$ m" bits, by adding the numerical data DT1 to DTm together, which are eight numerical results outputted by the multiple pulse position digitizing units 41 to 48. Instead of the adder 5, another processing unit of various types may be usable as long as the processing unit can output the numerical data DTA based on the digitization results of the multiple pulse position digitizing units 41 to 48.

In the above A-D conversion circuit 1, the delay time Td of each delay unit DU changes in accordance with the magnitude of the signal voltage level of the analog input signal Vin. As the signal voltage level of the analog input signal Vin is higher, the on-resistances of the transistors Mp and Mn constituting each delay unit DU are reduced, so that the delay time Td is shortened. Conversely, as the signal voltage level of the analog input signal Vin is lower, the ON resistances of the transistors Mp and Mn constituting each delay unit DU become higher, and as a result, the delay time Td becomes longer. Therefore, in accordance with the magnitude of the signal voltage level of the analog input signal Vin, the numerical data DT (DT1 to DT8) digitized by the multiple pulse position digitizing units 41 to 48 change. Therefore, the numerical data DTA obtained by adding the numerical data DT1 to DT8 corresponding to the analog input signal Vin is acquirable as A-D conversion data.

Each pulse position digitizing unit 41 to 48, which receives the corresponding sampling clock CK1 to CKm, operates in accordance with the timing of the clock edge of the corresponding sampling clock CK1 to CKm. FIG. 15 illustrates the outputs P1 to P4 among the outputs P1 to P15 of the delay units DU, the clock reference signal CKsa, and the clock edges of the sampling clocks CK1 to CK8 in part.

The latch circuits 12 of the pulse position digitizing units 41 to 48 preform latching at timings of clock edges of the sampling clocks CK1 to CK8. Therefore, the latch circuits 12 latch any of the H or L levels by performing latching at timings of clock edges of the finely-divided sampling clocks CK1 to CKm. The pulse selectors 13 detect the positions where the outputs of the latch circuits 12 change from H to L level and L to H level. Thereby, the arrival timing (arrival position) of the pulse signal PA can be detected.

As a result, the numerical data DT1 to DT8 output from the respective pulse position digitizing units 41 to 48 are synchronized with the corresponding sampling clocks CK1 to CK8 and updated at different timings. The adder 5 receives and adds these numerical data DT1 to DT8. The A-D conversion data DTA is obtained corresponding to the value that is obtained by averaging the numerical data DT1 to DT8 acquired by the pulse position digitizing units 41 to 48 within the period Ts (one cycle) of each sampling clock CK1 to CK8. The resolution of this numerical data DTA is higher resolution than those of the numerical data DT1 to DT8 obtained from the pulse position digitizing units 41 to 48, and moreover, becomes higher according to the number of bits m (m=eight in this case) to be added.

In the present embodiment, the clock generation circuit 3 includes the inverters Inv1 to Inv8. These inverters Inv1 to Inv8 include the n-channel transistors Mn and p-channel transistors Mp as the CMOS inverters 6 to 906. The number ratio p/n of the number of common-gate parallel-connected n-channel transistors Mn to the number of common-gate parallel-connected p-channel transistors Mp is different among the inverters Inv1 to Inv8. As a result, it is possible to construct the clock generation circuit 3 even if the design rule is refined.

Further, the FinFET structure 7 is used to construct the p-channel transistor Mp and the n-channel transistor Mn of the inverter Inv1 to Inv8. Therefore, a three-dimensional transistor is usable to construct the inverters Inv1 to Inv8.

Second Embodiment

Figure 16:
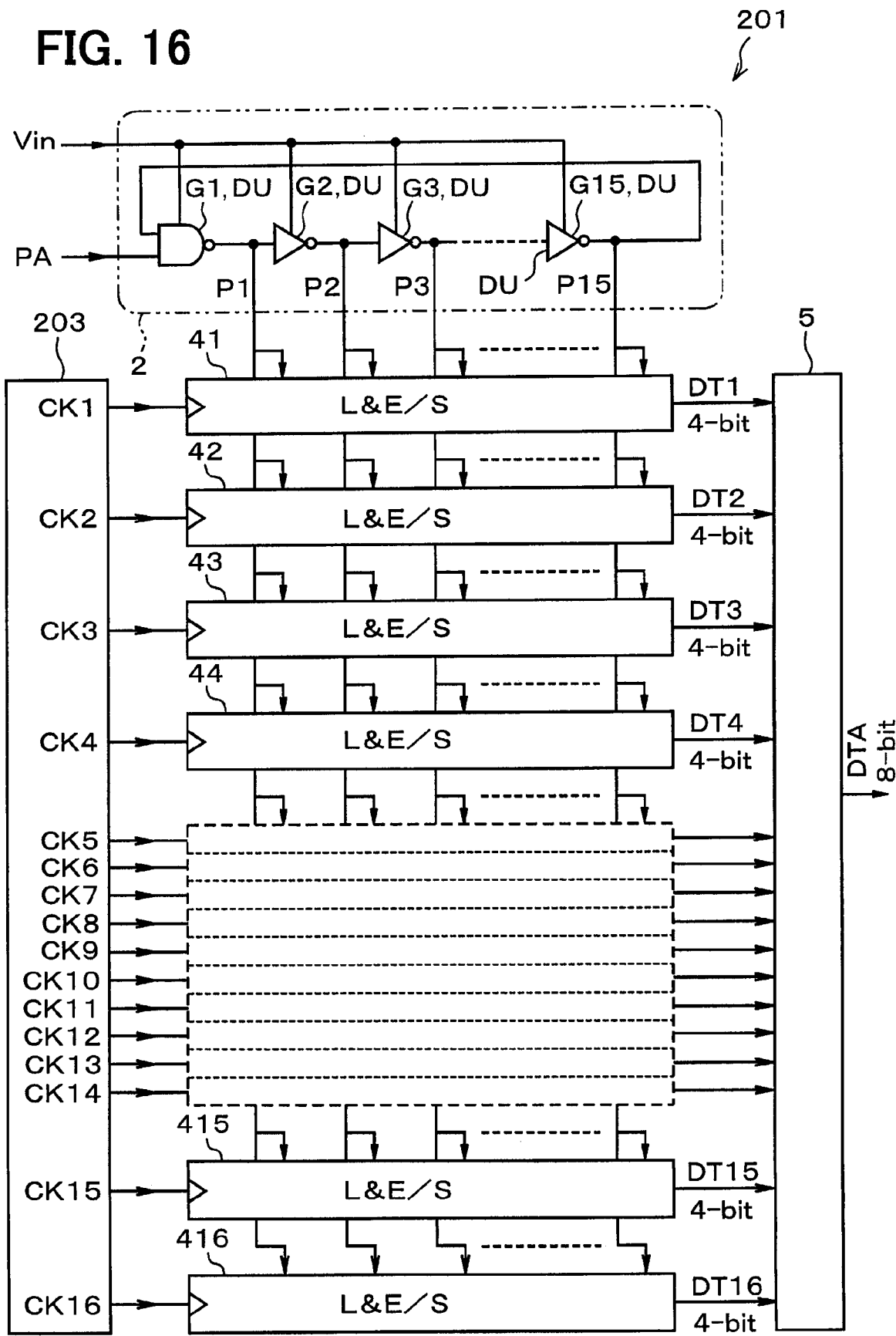
FIG. 16 is a diagram illustrating an electrical configuration of an A-D conversion circuit according to a second embodiment.
Figure 17:
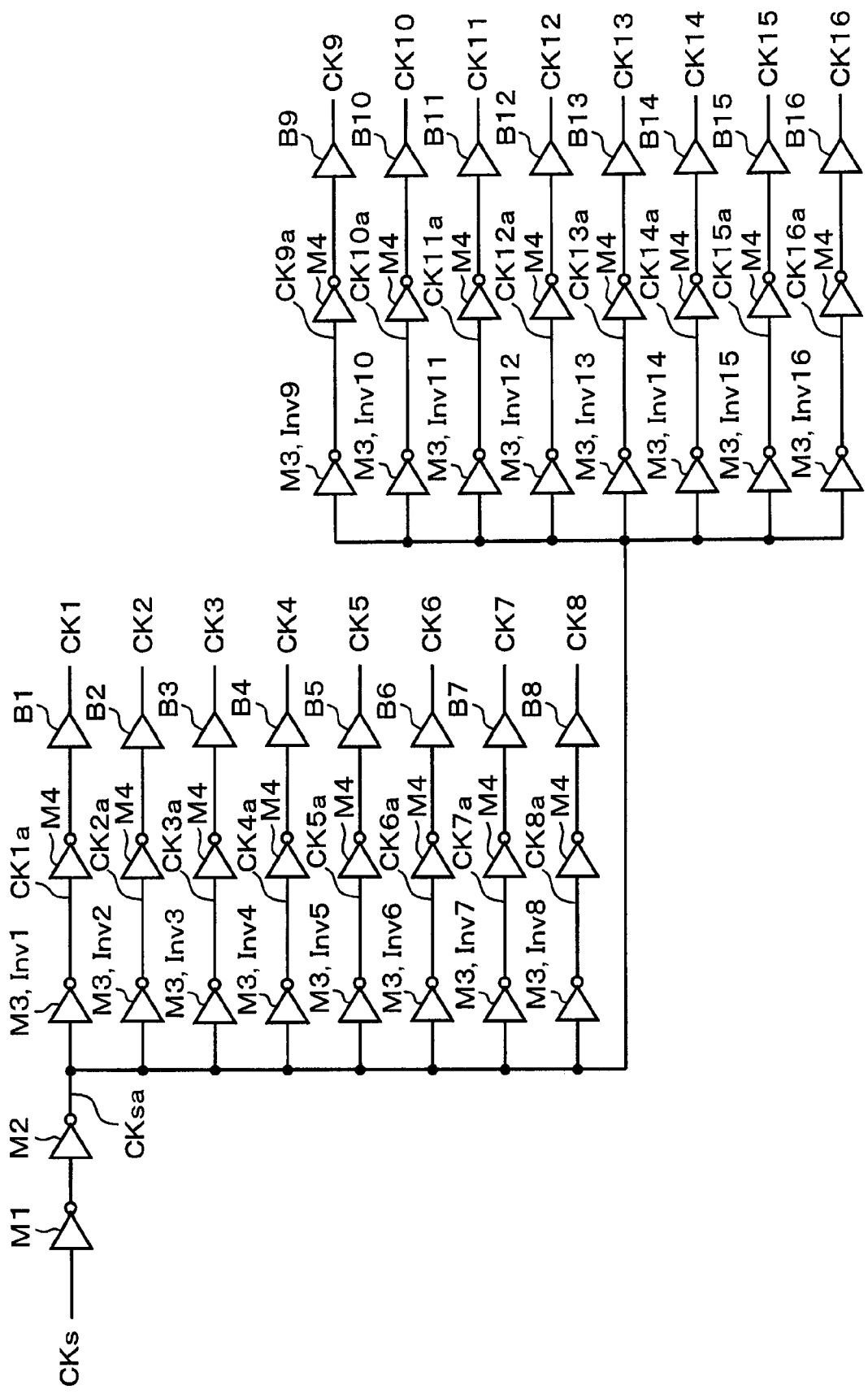
FIG. 17 is diagram of an electrical configuration of a clock generation circuit.
Figure 18:
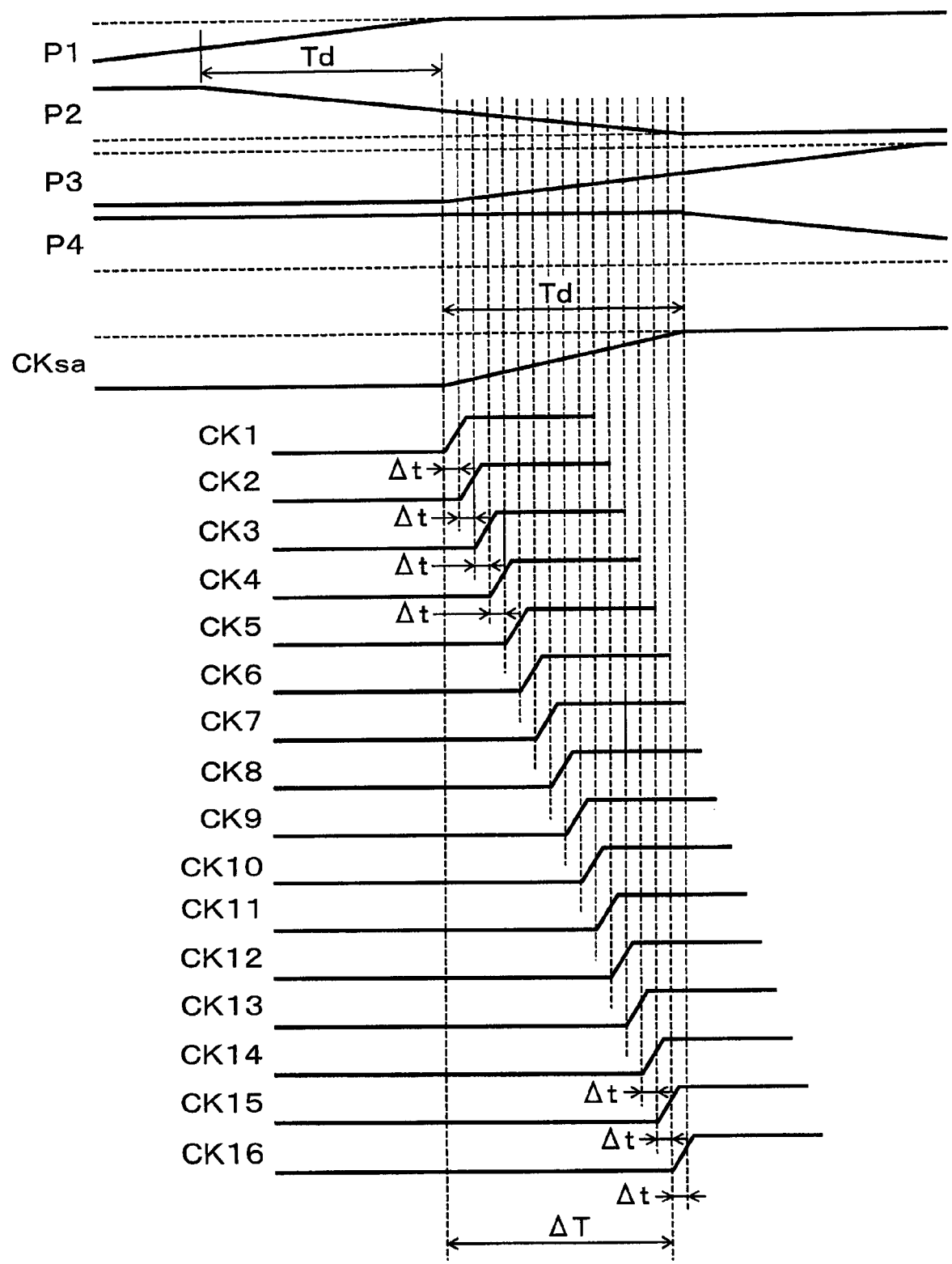
FIG. 18 is a diagram illustrating a temporal relationship between a delayed pulse signal and a clock edge of a sampling clock.

FIGS. 16 to 18 illustrate the second embodiment. In the first and second embodiments, like references are used to like parts to omit redundant description. FIG. 16 illustrates an electrical configuration of an A-D conversion circuit 201.

As shown in FIG. 16, the A-D conversion circuit 201 includes a pulse delay circuit 2, a clock generation circuit 203, multiple pulse position digitizing units 41 to 416, and an adder 5 serving as a processing unit. The same pulse delay circuit 2 as in the first embodiment is used in the second embodiment.

As shown in FIG. 17, the clock generation circuit 203 includes inverters M1 to M4 arranged to form the multi-stages (for example, four stages). The clock generation circuit 203 outputs multiple sampling clocks CK1 to CKm through buffers B1 to Bm. The buffers B1 to Bm are at the stage later than the inverters M1 to M4. Here, the inverter M1 is the first-stage, the inverter M2 is the second-stage, the inverters M3 is the third-stage, and the inverters M4 are the fourth-stage. The present embodiment employs m=16. The analog input signal Vin is applied to the inverters M1 to M4 in the multi-stages as power supply voltages (drive voltages). The delay time of the clock edge of the sampling clock CK1 to CK16 is adjusted in accordance with the delay time Td of the pulse signal PA of the pulse delay circuit 2. In this relation, the clock generation circuit 203 generates multiple sampling clocks CK1 to CK16 based on the clock reference signal CKs input as a reference. The clock reference signal CKs is a reference signal that is generated in synchronization with the output P1.

Input terminals In of the multiple inverters M3 are connected to the same node (see Inv1 to Inv16). For this reason, in the following description, the inverters M3 are referred to as M3 (Inv1 to Inv16) or Inv1 to Inv16 on an as-needed basis. In the example shown in FIG. 17, the single inverter M1 and the single inverter M2 are cascade-connected to form the first-stage and the second-stage, respectively. The output terminal Out of the second-stage inverter M2 is connected to input terminals In of the multiple third-stage inverters M3 (Inv1 to Inv16).

Next, the description will be given as to the number of p-channel transistors Mp and the number of n channel transistors Mn constituting each inverter M3 (Inv1 to Inv16). Examples of combinations of the number of common-gate connection p-channel transistors Mp and the number of common-gate connection n-channel transistors Mn include the following example (B).

(B1) Combination example B1
Inverter Inv1: (p, n)=(1, 9) (number ratio p/n=1/9)
Inverter Inv2: (p, n)=(2, 9) (number ratio p/n=2/9)
Inverter Inv3: (p, n)=(3, 9) (number ratio p/n=3/9)
Inverter Inv4: (p, n)=(4, 9) (number ratio p/n=4/9)
Inverter Inv5: (p, n)=(5, 9) (number ratio p/n=5/9)
Inverter Inv6: (p, n)=(6, 9) (number ratio p/n=2/3)
Inverter Inv7: (p, n)=(7, 9) (number ratio p/n=7/9)
Inverter Inv8: (p, n)=(8, 9) (number ratio p/n=8/9)
Inverter Inv9: (p, n)=(9, 9) (number ratio p/n=1.0)
Inverter Inv10: (p, n)=(9, 8) (number ratio p/n=9/8)
Inverter Inv11: (p, n)=(9, 7) (number ratio p/n=9/7)
Inverter Inv12: (p, n)=(9, 6) (number ratio p/n=3/2)
Inverter Inv13: (p, n)=(9, 5) (number ratio p/n=9/5)
Inverter Inv14: (p, n)=(9, 4) (number ratio p/n=9/4)
Inverter Inv15: (p, n)=(9, 3) (number ratio p/n=3.0)
Inverter Inv16: (p, n)=(9, 2) (number ratio p/n=9/2)

When the number ratio p/n of one inverter matches that of another inverter, the inverters have substantially the rise delay time difference $\Delta T$. Therefore, by reducing the number of p-channel transistor Mp or the number of n-channel transistors Mn of each inverter Inv9 from 9 for example, the following setting (B2) may be made.

(B2) Combination example B2
Inverter Inv1: (p, n)=(1, 9) (number ratio p/n=1/9)
Inverter Inv2: (p, n)=(2, 9) (number ratio p/n=2/9)
Inverter Inv3: (p, n)=(3, 9) (number ratio p/n=3/9)
Inverter Inv4: (p, n)=(4, 9) (number ratio p/n=4/9)
Inverter Inv5: (p, n)=(5, 9) (number ratio p/n=5/9)
Inverter Inv6: (p, n)=(6, 9) (number ratio p/n=2/3)
Inverter Inv7: (p, n)=(7, 9) (number ratio p/n=7/9)
Inverter Inv8: (p, n)=(8, 9) (number ratio p/n=8/9)
Inverter Inv9: (p, n)=(1, 1) (number ratio p/n=1.0)
Inverter Inv10: (p, n)=(9, 8) (number ratio p/n=9/8)
Inverter Inv11: (p, n)=(9, 7) (number ratio p/n=9/7)
Inverter Inv12: (p, n)=(9, 6) (number ratio p/n=3/2)
Inverter Inv13: (p, n)=(9, 5) (number ratio p/n=9/5)
Inverter Inv14: (p, n)=(9, 4) (number ratio p/n=9/4)
Inverter Inv15: (p, n)=(9, 3) (number ratio p/n=3.0)
Inverter Inv16: (p, n)=(9, 2) (number ratio p/n=9/2)

In the example of (B1), both the number of p-channel transistors Mp in the inverter Inv9 to Inv16 and the number of n-channel transistors Mn in the inverter Inv1 to Inv9 to Inv6 are uniformly set to the same number 9 serving as a maximum number. Thus, a variation in characteristic originating from the process is suppressible. Specifically, because at least either the number of p-channel transistors Mp or the number of n-channel transistors Mn is the same as the maximum number=9 in each inverter Inv1 to Inv16, the characteristic variation due to the process is suppressible.

In another example (B2), the number of n-channel transistors Mn and the number of p-channel transistors Mp in the inverter Inv9 satisfy the condition that one of the number of n-channel transistors Mn and the number of p-channel transistors Mp is divisible by the other. Therefore, while having characteristics similar to the example (B1), the example (B2) is provided with the reduced number of p-channel transistor Mp and the reduced number of n-channel transistor Mn of the inverter Inv9. As a result, the size is reducible. It may be preference to select a combination of the number of p-channel transistors Mp and the number of n-channel transistors Mn constituting the inverter Inv1 to Inv16 to match design circumstances.

Alternatively, the setting may be made as to equalize the number of n-channel transistors Mn, as shown in the following example.

(B3) Combination example B3
Inverter Inv1: (p, n)=(1, 16) (number ratio p/n=1/16)
Inverter Inv2: (p, n)=(2, 16) (number ratio p/n=1/8)
Inverter Inv3: (p, n)=(3, 16) (number ratio p/n=3/16)
Inverter Inv4: (p, n)=(4, 16) (number ratio p/n=1/4)
Inverter Inv5: (p, n)=(5, 16) (number ratio p/n=5/16)
Inverter Inv6: (p, n)=(6, 16) (number ratio p/n=3/8)
Inverter Inv7: (p, n)=(7, 16) (number ratio p/n=7/16)
Inverter Inv8: (p, n)=(8, 16) (number ratio p/n=1/2)
Inverter Inv9: (p, n)=(9, 16) (number ratio p/n=9/16)
Inverter Inv10: (p, n)=(10, 16) (number ratio p/n=5/8)
Inverter Inv11: (p, n)=(11, 16) (number ratio p/n=11/16)
Inverter Inv12: (p, n)=(12, 16) (number ratio p/n=3/4)
Inverter Inv13: (p, n)=(13, 16) (number ratio p/n=13/16)
Inverter Inv14: (p, n)=(14, 16) (number ratio p/n=7/8)
Inverter Inv15: (p, n)=(15, 16) (number ratio p/n=15/16)
Inverter Inv16: (p, n)=(16, 16) (number ratio p/n=1)

In addition, since the delay time of the inverter M3 is approximately unchanged when the number ratio p/n is unchanged, the following setting may be used; for the inverter Inv16, (p, n)=(1, 1); for the inverter Inv2, (p, n)=(1, 8); for the inverter Inv4, (p, n)=(1, 4); for the inverter Inv6, (p, n)=(3, 8); for the inverter Inv8, (p, n)=(1, 2); for the inverter Inv10, (p, n)=(5, 8); for the inverter Inv12, (p, n)=(1, 4); for the inverter Inv14, (p, n)=(7, 8).

Alternatively, the setting may be made so as to equalize the number of p-channel transistors Mp, as shown in the following example of (B4). (B4) Combination Example B4
Inverter Inv1: (p, n)=(16, 16) (number ratio p/n=1)
Inverter Inv2: (p, n)=(16, 15) (number ratio p/n=16/15)
Inverter Inv3: (p, n)=(16, 14) (number ratio p/n=8/7)
Inverter Inv4: (p, n)=(16, 13) (number ratio p/n=16/13)
Inverter Inv5: (p, n)=(16, 12) (number ratio p/n=4/3)
Inverter Inv6: (p, n)=(16, 11) (number ratio p/n=16/11)
Inverter Inv7: (p, n)=(16, 10) (number ratio p/n=8/5)
Inverter Inv8: (p, n)=(16, 9) (number ratio p/n=16/9)
Inverter Inv9: (p, n)=(16, 8) (number ratio p/n=2)
Inverter Inv10: (p, n)=(16, 7) (number ratio p/n=16/7)
Inverter Inv11: (p, n)=(16, 6) (number ratio p/n=8/3)
Inverter Inv12: (p, n)=(16, 5) (number ratio p/n=16/5)
Inverter Inv13: (p, n)=(16, 4) (number ratio p/n=4)
Inverter Inv14: (p, n)=(16, 3) (number ratio p/n=16/3)
Inverter Inv15: (p, n)=(16, 2) (number ratio p/n=8)
Inverter Inv16: (p, n)=(16, 1) (number ratio p/n=16)

In addition, since the delay time is approximately unchanged when the number ratio p/n is unchanged, the setting may be made as follows: for the inverter Inv1, (p, n)=(1, 1); for the inverter Inv3, (p, n)=(8, 7); for the inverter Inv5, (p, n)=(4, 3); for the inverter Inv7, (p, n)=(8, 5); for the inverter Inv9, (p, n)=(2, 1); for the inverter Inv11, (p, n)=(8, 3); for the Inverter Inv13, (p, n),=(4, 1); and/or for the inverter Inv15, (p, n)=(8, 1).

As long as the inverters Inv1 to Inv16 have the different number ratios p/n of the number of gate-common parallel-connected p-channel transistors Mp to the number of gate-common parallel-connected n-channel transistors Mn, the numbers may be arbitrary. When the number ratios p/n of the p-channel transistor Mp to the n-channel transistor Mn of the inverters Inv1 to Inv8 are set to increase in order from the inverter Inv1 to the inverter Inv16 as is the case in (B1) to (B4), it is possible to sequentially increase the time differences ΔT in delay of the clock edge rising in the inverters Inv1 to Inv16.

In this relation, as shown in FIG. 18, it may be preferable to set the number of p-channel transistors Mp and the number of n-channel transistors Mn in each inverter Inv1 to Inv16 so that a time difference Δt in clock edge between each sampling clock CK 1 to CK8 and its adjacent sampling clock is set to a constant time period that is one sixteenth (=1/m) of the delay time Td.

In other respects, the clock generation circuit 203 can employ substantially the same configuration as the clock generation circuit 3 of the first embodiment. Configurations of the pulse position digitizing units 41 to 416 shown in FIG. 16 are similar to those of the pulse position digitizing units 41 to 48 in the first embodiment. In this regard, redundant description is not given here.

In the present embodiment, because of m=16, the latch circuits 12 of the pulse position digitizing units 41 to 416 can perform latching at the timings of the clock edges of the sampling clocks CK1 to CK16 obtained by dividing the delay time Td into a shorter period as compared with the first embodiment. Additionally, because of the bit number m is 16, the second embodiment can provide higher resolution than the first embodiment.

Third Embodiment

Figure 19:
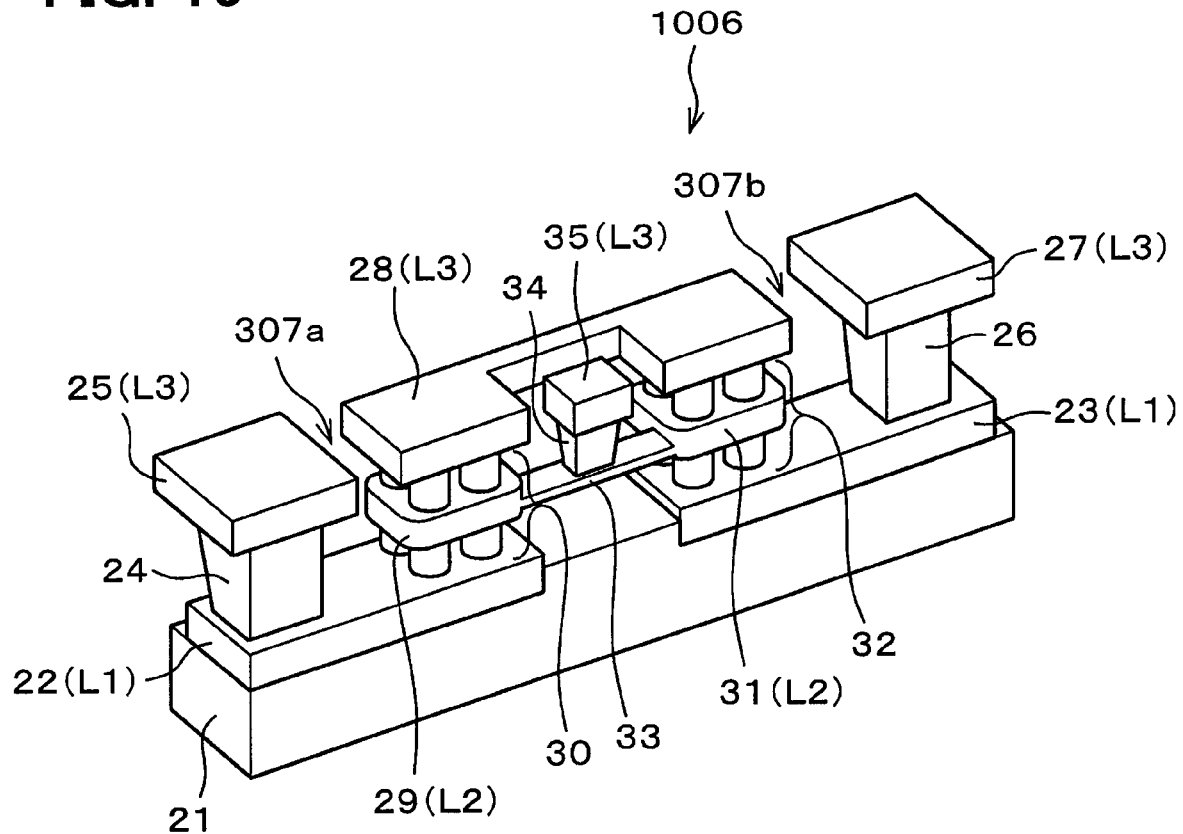
FIG. 19 is a perspective view schematically illustrating a nanowire FET (Field-Effect transistor) structure according to a third embodiment.
Figure 22:
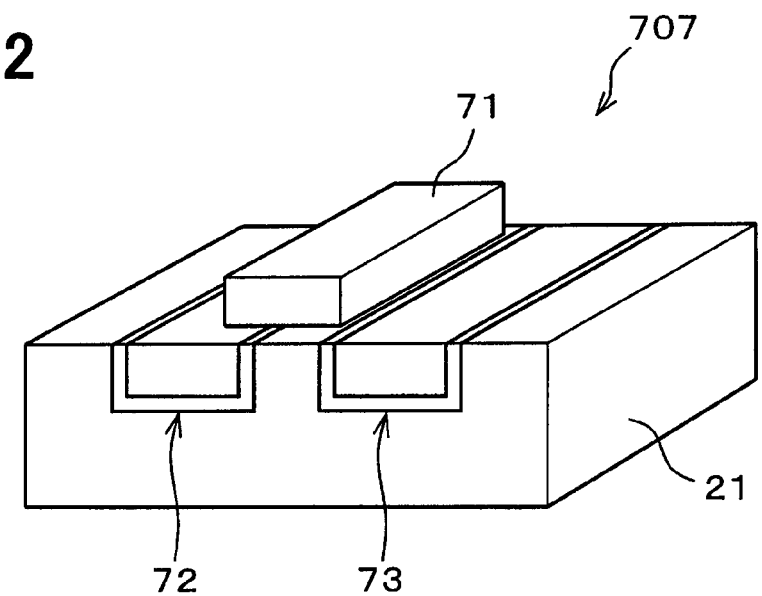
FIG. 22 is a perspective view schematically illustrating a planar MOSFET (Metal-Oxide-Semiconductor Field-Effect Transistor) structure.

IG. 19 to FIG. 22 illustrate the third embodiment. The third embodiment employs a transistor structure other than the FinFET structure 7. FIG. 19 illustrates nanowire FET structures 307a, 307b and an inverter 1006 using these nanowire FET structures 307a, 307b.

As shown in FIG. 19, a pair of lower wiring layers 22 and 23 separated from each other is provided in a layer L1 above a silicon substrate 21. Between a pair of lower wiring layers 22 and 23, there is an insulating film (now shown). A wiring layer 25 is above one of the lower wiring layers 22 and 23 is arranged in a layer L3 above one of the lower wiring layers 22 through a via 24. The wiring layer 25 is grounded to a ground potential. The wiring layer 27 is arranged in the layer L3 above the other lower wiring layer 23 through the via 26. The wiring layer 27 is a layer to which an analog input signal Vin is applied. Above the pair of lower wiring layers 22 and 23, nanowire FET structures 307a and 307b are formed respectively. The nanowire FET structures 307a and 307b may extend in, for example, in a vertical direction.

An upper wiring layer 28 is formed in the layer L3 above the lower wiring layer 22. An intermediate gate layer 29 is provided in the layer L2 between the upper wiring layer 28 and the lower wiring layer 22. The nanowire FET structure 307 a shown in FIG. 19 includes a nanowire channel 30 penetrating the intermediate gate layer 29 between the upper wiring layer 28 and one lower wiring layer 22.

The upper wiring layer 28 is arranged just above the lower wiring layer 23. The intermediate gate layer 31 is provided in the layer L2 between the upper wiring layer 28 and the lower wiring layer 23. In addition, the nanowire FET structure 307 b includes a nanowire channel 32 penetrating the intermediate gate layer 31 between the upper wiring layer 28 and the other lower wiring layer 23. The intermediate gate layers 29 and 31 are connected to each other in the layer L2 at the connecting portion 33. The upper wiring layer 35 is in the layer L3 and arranged above the connecting portion 33 through the via 34.

The upper wiring layer 28 in the layer L3 is a layer corresponding to the output terminal Vout of the inverter 1006. The upper wiring layer 35 in the layer L3 is a layer corresponding to the input terminal In to which the gate voltage of the inverter 1006 is input. The nanowire FET structures 307a and 307b are constructed in this way. The inverter 1006 using such nanowire FET structures 307a and 307b is usable in place of the inverter 6 to 906 described in the above embodiments.

Figure 20:
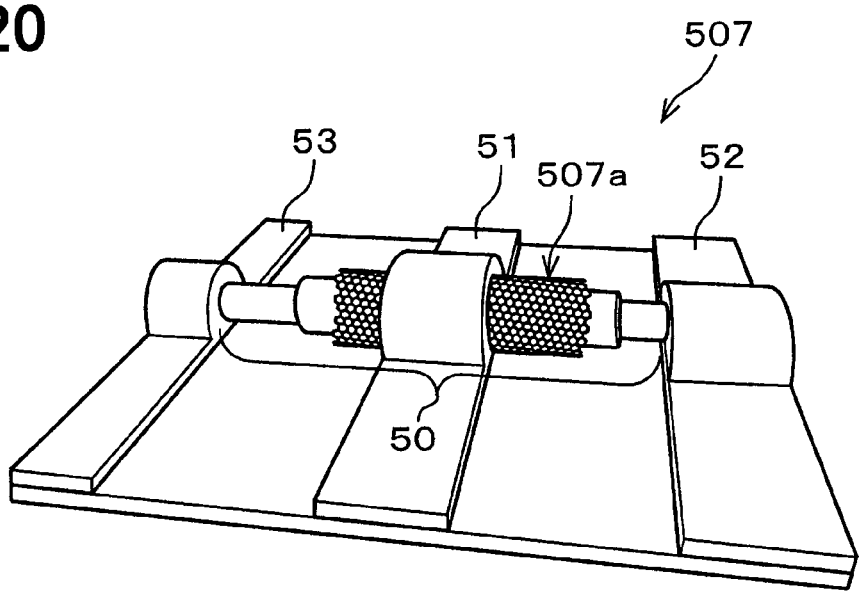
FIG. 20 is a perspective view schematically illustrating showing a carbon nanotube FET structure.

FIG. 20 schematically illustrates a carbon nanotube FET structure 507 which is replicable with the FinFET structure 7. The carbon nanotube FET structure 507 is provided with a field effect transistor that uses the carbon nanotube 507a as a channel 50. The carbon nanotube 507a has a tubular shape in which carbon atoms (C) are connected in a mesh-like manner. The gate electrode 51 is arranged so as to cover a part of the carbon nanotube 507a. Source and drain electrodes 52 and 53 separated from each other are arranged on both sides of the gate electrode 51. By using such a carbon nanotube FET structure 507, it is possible to change the numbers of common-gate parallel-connected transistors Mp and Mn by providing a common electric potential to the gate electrodes using, for example, another wiring layer (not shown). Moreover, in the inverters 6 to 906, it is possible to connect the carbon nanotube FET structures 507 using a wiring layer (not shown).

Figure 21:
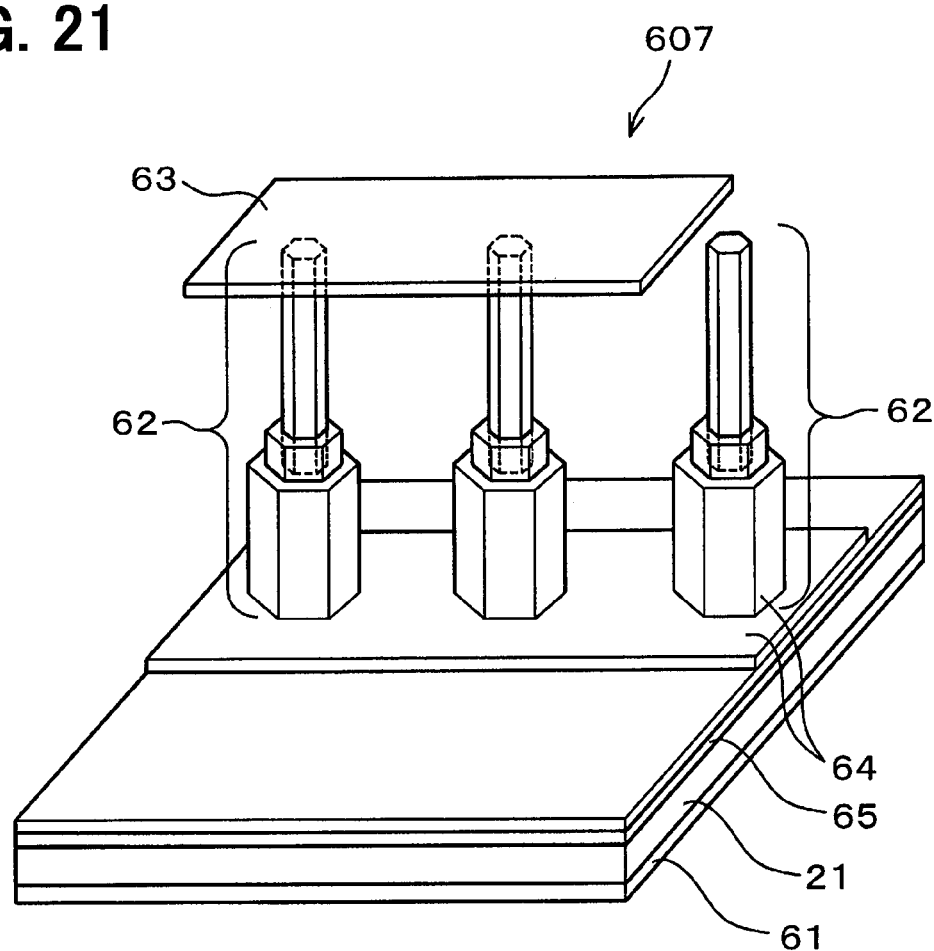
FIG. 21 is a perspective view schematically illustrating a tunnel FET structure.

FIG. 21 schematically illustrates a tunnel FET structure 607. The tunnel FET structure 607 is for a field effect transistor utilizing a tunnel effect. In the tunnel FET structure 607, a source electrode layer 61 arranged below the silicon substrate 21 through an insulating film (not shown).

A channel 62 is extended upward to the upper wiring layer 63 from the upper portion of the silicon substrate 21. The upper wiring layer 63 is used as a drain electrode. A gate electrode 64 is arranged to cover a side portion of the channel 62 and to cover a portion above the silicon substrate 21. An insulating film 65 is arranged between the gate electrode 64 and the silicon substrate 21. In such a tunnel FET structure 607 as shown in FIG. 21, it is possible to arrange multiple structures in which the gate electrodes 64 have a common electric potential. Further, it is possible to change the numbers of gate-common parallel-connected transistors Mp and Mn. Moreover, the inverters 6 . . . 906 can be configured by using the tunnel FET structure 607 and connecting using a wiring layer (not shown).

FIG. 22 illustrates a schematic perspective view of a planar transistor structure 707. This planar transistor structure 707 is for a MOSFET having the following structure. A gate electrode 51 is arranged above a silicon substrate 21 through a gate insulating film (not shown). In a surface layer of the silicon substrate 21, a source 72 and a drain 73 are arranged on both sides of so that the gate electrode 51 is between the source 72 and side surface of the silicon substrate 21 on both sides of the gate electrode 51. It is possible to arrange multiple such planar transistor structures 707 side by side and provide a common electric potential at the gate electrodes 71 by using a wiring layer (not shown). This makes it possible to change the numbers of common-gate parallel-connected transistors Mp and Mn. Moreover, in the inverters 6 to 906, it is possible to connect the planar transistor structure 707 using a wiring layer (not shown).

Even if design rules are miniaturized, it is possible to construct the clock generation circuits 3 and 203 of the above-described embodiments by using various structures 307a, 307b, 507, 607, and 707. As a result, it is possible to generate a large number of sampling clocks CK1 to CKm.

Other Embodiments

The above described embodiments are not limiting and can be modified and extended in various ways, examples of which will be described below. In the above description, the gate circuit G2 to G15 is constructed with a single-stage inverter 6. Alternatively, a CMOS inverter in which the inverters 6 are connected to form two stages may be used. Specifically, the pulse delay circuit 2 may be constructed such that the multiple delay units each delaying the pulse signal to output the signal without inverting the signal are connected in series. In this case, the variation in A-D conversion results can be suppressed as compared with the configuration using the single-stage CMOS inverter 6.

In the above description, the inverters M3 for making a difference in clock edge generation timing between the sampling clocks CK1 to CK8, CK1 are provided as the inverters nv1 to Inv8, Inv1 to Inv16 arranged to form only the single-stage. However, the inverters nv1 to Inv8, Inv1 to Inv16 may be arranged to form two or more stages. The inverters nv1 to Inv8, Inv1 to Inv16 may be arranged to form at least a single stage. In the embodiments, the number of sampling clocks CK1 to CKm of the clock generation circuits 3 and 203 is eight and sixteen, and the number of inverters M3 (Inv1 to Inv8, Inv1 to Inv16) is eight and sixteen. However, these are not limited to eight or sixteen. The numbers may be set to any suitable numbers.

In the above description, the pulse delay circuit 2 has such a structure in which the delay units DU provided as the NAND gate G1 and the NOT gates G2 to G15 are connected in a ring arrangement. This is however not limiting.

As long as the delay units DU are connected in series, the delay units DU may not be connected in the ring arrangement.

The above described embodiments are combinable with regard to, for example, configuration and function. Embodiments obtained by omitting some parts from the above embodiments are also considered embodiments. In addition, all possible aspects are considered embodiments without departing from the spirit and scope of the disclosure.

Although the present disclosure has been described in accordance with the embodiments described above, it is understood that the present disclosure is not limited to the embodiments and structures. The present disclosure is intended to cover various modifications and variations within the equivalent range. In addition, various combinations and configurations, as well as other combinations and configurations, including more, less, or only single element, are also within the spirit and scope of the present disclosure.

What is claimed is:

1. An A-D conversion circuit configured to convert an analog input signal into numerical data using a pulse delay circuit in which a plurality of delay units each for delaying and outputting a pulse signal with or without inverting the pulse signal are connected in series, the A-D conversion circuit comprising:
   a plurality of pulse position digitizing units that, at different timings, digitize a position of the pulse signal when the pulse delay circuit transmits the pulse signal through the delay units;
   a clock generation circuit that includes a plurality of inverters connected as at least a one-stage circuit, and that, based on an input clock reference signal, outputs a plurality of sampling clocks having mutually-different clock edge timings; and a processing unit that outputs the numerical data relating to A-D conversion based on digitization results of the plurality of pulse position digitizing units, wherein:

each of the plurality of inverters includes one or more n-channel transistors and one or more p-channel transistors;

the plurality of inverters are different from each other in a number ratio between the number of n-channel transistors connected in a common-gate and parallel-connection manner and the number of p-channel transistors connected in a common-gage and parallel-connection manner;

the plurality of pulse position digitizing units include latch circuits that latch the pulse signal of the pulse delay circuit at different timings in accordance with the clock edges of the sampling clocks; and the plurality of pulse position digitizing units digitize the position of the pulse signal at different timings.

2. The A-D conversion circuit according to claim 1, wherein:

the number of n-channel transistors is one or more; and
the number of p-channel transistors is two or more.

3. The A-D conversion circuit according to claim 1, wherein:

the number of n-channel transistors is two or more; and
the number of p-channel transistors is one or more.

4. The A-D conversion circuit according to claim 1, wherein:

in each inverter, a maximum number is one of the number of n-channel transistors and the number of p-channel transistors that is greater than or equal to the other of the number of n-channel transistors and the number of p-channel transistors; and the maximum number is constant among the plurality of inverters.

5. The A-D conversion circuit according to claim 1, wherein the number of n-channel transistors and the number of p-channel transistors satisfy a condition that:

the number of n-channel transistors is divisible by the number of p-channel transistors; or the number of p-channel transistors is divisible by the number of n-channel transistors.

6. The A-D conversion circuit according to claim 1, wherein the n-channel transistor and the p-channel transistor have a FinFET structure.

7. The A-D conversion circuit according to claim 1, wherein the n-channel transistor and the p-channel transistor have a nanowire FET structure.

8. The A-D conversion circuit according to claim 1, wherein the n-channel transistor and the p-channel transistor have a tunnel FET structure.

9. The A-D conversion circuit according to claim 1, wherein the n-channel transistor and the p-channel transistor have a carbon nanotube FET structure.

10. The A-D conversion circuit according to claim 1, wherein the n-channel transistor and the p-channel transistor have a planar transistor structure.

* * * * *